United States Patent [19]

Hoshino et al.

[11] Patent Number: 5,529,879
[45] Date of Patent: Jun. 25, 1996

[54] PHOTOSENSITIVE SHEET COMPRISING A SUBSTRATE HAVING A MOLECULAR ORIENTATION RATIO IN THE RANGE OF FROM 1.0 TO 1.4

[75] Inventors: Mitsuhide Hoshino; Fukuo Murata; Norio Yabe; Masahide Takano, all of Saitama-ken, Japan

[73] Assignee: Nippon Paper Industries Co., Ltd., Tokyo, Japan

[21] Appl. No.: 41,045

[22] Filed: Mar. 31, 1993

[30]   Foreign Application Priority Data

Sep. 25, 1992   [JP]   Japan .................... 4-256286

[51] Int. Cl.⁶ ............... G03F 7/11; G03F 7/021; G03C 1/795
[52] U.S. Cl. ............ 430/160; 430/143; 430/166; 430/167; 430/257; 430/260; 430/262; 430/263; 430/271.1; 430/293
[58] Field of Search ................... 430/167, 260, 430/293, 257, 254, 143, 271, 175, 262, 263, 160, 166

[56]   References Cited

U.S. PATENT DOCUMENTS

| | | | |
|---|---|---|---|
| 3,778,272 | 12/1973 | Hepher | 430/262 |
| 3,793,026 | 2/1974 | Reyniers et al. | 96/49 |
| 4,482,626 | 11/1984 | Namiki et al. | 430/143 |
| 4,656,114 | 4/1987 | Cederberg et al. | 430/143 |
| 4,666,817 | 5/1987 | Sachi | 430/143 |
| 4,842,950 | 6/1989 | Barton | 430/167 |
| 5,001,034 | 3/1991 | Omote et al. | 430/257 |
| 5,002,850 | 3/1991 | Shinozaki et al. | 430/167 |
| 5,019,471 | 5/1991 | Mino et al. | 430/262 |
| 5,223,374 | 6/1993 | Mohr et al. | 430/257 |
| 5,232,814 | 8/1993 | Graves et al. | 430/156 |
| 5,273,855 | 12/1993 | Omote et al. | 430/263 |
| 5,286,597 | 2/1994 | Suzuki et al. | 430/262 |

FOREIGN PATENT DOCUMENTS

| | | | |
|---|---|---|---|
| 995428 | 12/1951 | France . | |
| 53-134421 | 11/1978 | Japan . | |
| 61-186954 | 8/1986 | Japan . | |
| 63-305349 | 12/1988 | Japan . | |
| 397523A | 4/1991 | Japan | B29C 55/12 |
| 1254475 | 8/1968 | United Kingdom . | |

*Primary Examiner*—John S. Y. Chu
*Attorney, Agent, or Firm*—Roylance, Abrams, Berdo & Goodman

[57]   ABSTRACT

This invention relates to a photosensitive sheet having on a substrate one or more resin layers that are peelable from the substrate and heat-fusible, and a colored photosensitive layer in this order, said substrate comprising a biaxially stretched plastic film and having a molecular orientation ratio in the range of from 1.0 to 1.4.

The object of this invention is to solve the problem of misregister without decreasing productivity during the formation of plastic film (substrate) or during the production of a photosensitive sheet in a method in which said photosensitive sheet having an image formed thereon and an image receiving sheet for receiving the image are superimposed on each other, and pressed and heated for image transfer.

12 Claims, 1 Drawing Sheet

STEP (1)

STEP (2)

STEP (3)

STEP (4)

STEP (5)

PHOTOSENSITIVE SHEET COMPRISING A SUBSTRATE HAVING A MOLECULAR ORIENTATION RATIO IN THE RANGE OF FROM 1.0 TO 1.4

FIELD OF THE INVENTION

The present invention relates to a multicolor image forming material, and more specifically, to a material for obtaining a prepress color proof for use mainly in a proofing operation indispensable for a photomechanical process.

BACKGROUND OF THE INVENTION

When a printing plate using a reprographic material, such as a PS plate, is to be prepared from a color original so that many prints will be made, halftone separation negatives (or positives) of normally four colors are prepared from the color original by means of a color scanner. Then, the negatives or positives are subjected to such steps as pasting-up, reversing and retouching, to form block copies of the respective colors. Proof prints are made using the block copies, and the state of a final finish is confirmed. Afterwards, printing is performed. In this case, checking is done for separation with the scanner in the step of preparing the halftone separation negatives or positives; for pasting-up, etc. in the step of preparing the separation positives; and for final finish in the proof printing step. For this checking work, color proofs are prepared at each step. Various photosensitive materials are utilized for color proof preparation. For instance, those for the silver halide-photographic process, those for electrophotography, and those using photopolymers are known. To produce color images, those containing pigments or dyes are used. Both the negative-positive process and the positive-positive process are available depending on the intended purpose. Typical examples of the methods for preparing color proofs include the following: First, a photosensitive layer of a photosensitive material having said photosensitive layer on a substrate is transferred onto a transfer paper by pressure and heat, whereafter the photosensitive layer is imagewise exposed and developed to form an image of a first color on the transfer paper. Then, a second photosensitive layer is transferred onto the transfer paper in the same manner, followed by imagewise exposure and development, thereby forming an image of a second color on the transfer paper. This procedure is carried out a total of 4 times for yellow, magenta, cyan and black, thereby forming a multicolor image. The transfer of the photosensitive layers onto the transfer paper can be performed by various methods, including those using only pressure, pressure and heat combined simultaneously, etc. An example of such method comprises heating one or both of a pair of pressurized rollers, and passing between the pair of rollers a photosensitive sheet having a photosensitive layer and a transfer paper superimposed on each other, thereby transferring the photosensitive layer onto the transfer paper. This method, however, poses problems in terms of the operating efficiency and the cost of preparing color proofs.

An image forming method, to which the photosensitive sheet of the present invention is applied, imparts imagewise exposure to said sheet, then carries out development, and transfers the resulting image to an image receiving sheet, thereby forming a color proof. Namely, this method comprises treating a photosensitive sheet with the below-mentioned steps, said photosensitive sheet having an image-forming colored photosensitive layer on a substrate via a peelable, heat-fusible resin layer.

(1) a step of exposing the photosensitive material with actinic radiation through an original in contact with the photosensitive material (this may be called contact exposure), and then developing the unexposed areas to form an image;

(2) a step of bringing the image-bearing surface into contact with a heat-fusion surface of a transfer material having a heat-fusible layer, heating and pressing both surfaces, then peeling the substrate from the heat-fusible resin layer, thereby transferring the colored image onto the transfer material together with the heat-fusible resin layer;

in which step (1) the photosensitive materials having the colored layers of different tones are made ready for use, the original is selected depending on each tone, and contact exposure and development are performed, whereby the images are formed, and in which step (2) the colored image of a specified tone is transferred onto the transfer material; then (3) a step of bringing the image bearing surface of the photosensitive material having formed thereon a colored image of a tone different from the above tone into contact with the colored image-transferred surface of the transfer material obtained in step (2), heating and pressing both surfaces, then peeling the substrate from the heat-fusible resin layer, thereby transferring the colored image onto the colored image-transferred surface of the transfer material together with the heat fusible resin layer; and then repeating step (3) for a third or more colors.

In this case as well, the method of transferring the image onto the image receiving sheet involves the simultaneous execution of pressing and heating. Namely, one or both of a pair of pressure rollers is or are heated, and the image bearing sheet and the image receiving sheet are passed in a superimposed state between the rollers, thereby transferring the image. This method is different from the aforementioned method in which the photosensitive layer transferred onto the transfer paper is exposed to form an image. According to the former method, the formed color images are sequentially transferred onto the image receiving sheet one color at a time. Therefore, exposure for four colors can be performed at the same time, thus shortening the operating time. However, after the images are formed, they are transferred. Hence, misregister involving color distortion may occur easily even when the transfer of the images has been done accurately.

So far, the use of an ordinary transferring apparatus has required extremely high temperatures because of the short heating time. This has posed the problem that the sheets inserted between the rollers are partially elongated, causing the misregister or transfer unevennesses of the transferred images. The misregister is a serious problem since the transfer of images is normally performed 4 times.

To solve the problem of misregister, several methods have been proposed, including one in which the substrate, plastic film, is annealed to reduce its heat shrinkage and prevent dimensional changes (Japanese Laid-Open Patent Publication No. Sho. 63-305349). However, pressure is also applied during the actual transfer operation, and thus annealing alone cannot completely prevent dimensional changers of the plastic film. Hence, misregister cannot be eliminated. It is known that misregister is reduced if the width-wise positions of the plastic film formed are designated and only that amount of the film which corresponds to the same positions is used as the image bearing sheet. (For example, that amount of the film formed which corresponds to the width of 5,000 mm to 1,100 mm is slit, and four colors are allocated only at the same positions in the direction of flow). This will, however, considerably lower productivity during film formation or image bearing sheet production.

Even with the thus produced image bearing sheet, misregister cannot necessarily be corrected, if it is used in a small size, say, by taking a piece 508 mm×610 mm (width× length) from each of the left and right sides of the middle in the width direction of the film formed, and using the two portions in a mixed manner. Hence, only either the right or left portion must continue to be used, making operating efficiency low.

SUMMARY OF THE INVENTION

The object of the present invention is to solve the problem of misregister without decreasing productivity during film formation or during the production of a photosensitive sheet in a method in which said photosensitive sheet having an image formed thereon and an image receiving sheet for receiving the image are superimposed on each other, and pressed and heated for image transfer.

To solve the problem of misregister, we, the present inventors, found the film displaced in a direction perpendicular to the molecular chain (main axis) when observing the motion of the film during image transfer. Normally, a biaxially stretched plastic film has physical properties, such as tensile strength and thermal expansion coefficient, differing between the longitudinal and transverse directions. These directional differences in the properties are attributable to bowing that occurs during a plastic film forming step (a phenomenon in which the film is stretched with both ends thereof being gripped by clips, so that the middle part of the film is stretched later than both edges thereof, whereby the orientation of the molecular chains of the film is distorted in the width direction of the film). As a result, when force is applied to the film, deformation takes place in a direction of lower strength from the point at which the force is applied. We have found that misregister occurs because force applied to the substrates of the image bearing sheet and the image receiving sheet by pressing and heating during transfer as in the present invention induces deformation in a direction of lower strength.

The aforementioned object of the present invention is achieved by a photosensitive sheet for use as a multicolor image forming material in a method in which the sheet having an image formed thereon and an image receiving sheet for receiving the image are superimposed on each other, and pressed and heated for image transfer, characterized in that the molecular orientation ratio of a biaxially stretched plastic film used as the substrate of the image bearing sheet is set at 1.0–1.4 to eliminate unevenness of strength.

Such a biaxially stretched plastic film with a molecular orientation ratio of 1.0–1.4 can be obtained by the invention of Japanese Laid-Open Patent Publication No. Hei 3-97523. Said invention, however, is intended to impart good processability during the application of a magnetic layer for magnetic discs; it is not designed to prevent misregister during the transfer of photosensitive sheets as in the present invention. Nor does it suggest such prevention.

The following is a description of a method of producing a biaxially stretched polyethylene terephthalate film which description is set forth in Japanese Laid-Open Patent Publication No. Hei 3-97523, the publication referred to above.

A biaxially stretched polyester film was made having a molecular orientation ratio in the range of 1.0 to 1.4. In the example of this Japanese Laid-Open Patent Publication, the aromatic dicarboxylic acid used to make the polyester was terephthalic acid and the glycol used to make the polyester was ethylene glycol. In order to make the stretched polyester film, the biaxial stretching method conducted comprised the following steps:

(a) extruding the molten polyethylene terephthalate, (b) rapidly cooling and solidifying the extruded polyethylene terephthalate to form an unstretched film and then (c) longitudinally stretching it by 3.6 times. The longitudinally stretched film was subjected to a tenter; the film was heated in a transverse stretching area by 3.6 times through multiple stages of heating, e.g., a former stage at 100° C., and a later stage at 170°–220° C. Thus, the film was extended by 15% in the transverse direction and was fixed by heat at 215° C. After cooling the heat-fixed film below 100° C., it was float-treated with heated air at 140° C. without restricting the width direction and was relaxation-treated in biaxial directions (width and longitudinal directions) for 1 to 5 minutes with a tension of 5 Kg/cm$^2$.

DETAILED DESCRIPTION OF THE INVENTION

The present invention will be described in more detail below.

Figure 1:
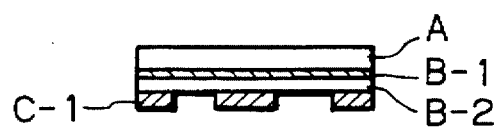
Figure 1:
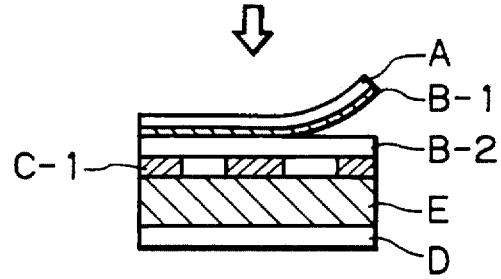
Figure 1:
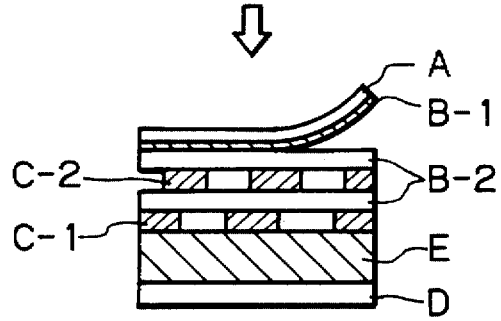
Figure 1:
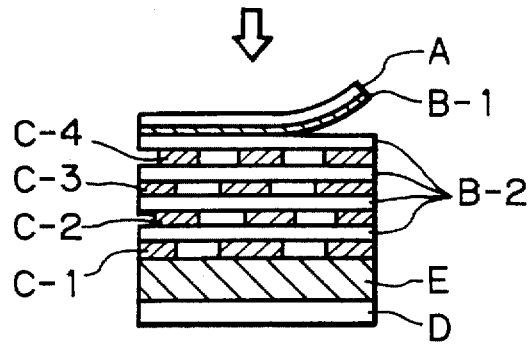
Figure 1:
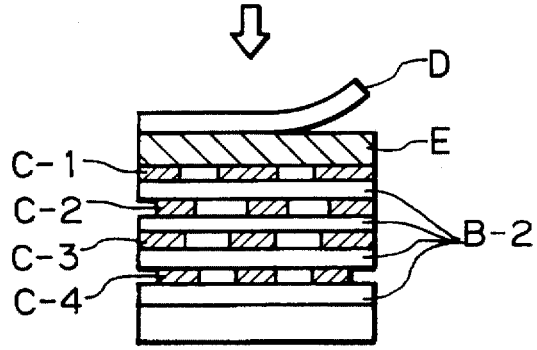

FIG. 1 schematically illustrates stepwise the method of forming a multicolor image using the photosensitive sheet of the invention, with reference to the photosensitive sheet for obtaining a negative. However, the present invention is in no way limited to a photosensitive sheet for a negative, but is also applicable to a photosensitive sheet for a positive.

In FIG. 1, A represents a substrate of a photosensitive sheet comprising a plastic film to which the present invention is directed; B-1 represents a release layer of the photosensitive sheet; B-2 represents a heat-fusible layer of the photosensitive sheet; C-1 through C-4 each represent a colored image of a different tone obtained by exposing a colored photosensitive layer of a different color of the photosensitive sheet through a negative original in contact with the photo-sensitive sheet, and developing the unexposed areas; D represents a substrate of an image receiving sheet; and E represents a heat-fusible layer of the image receiving sheet.

The substrate of the photosensitive sheet in accordance with the present invention is a biaxially stretched plastic film, especially polyethylene terephthalate, polyethylene naphthalate or polyimide, having a molecular orientation ratio in the range of from 1.0 to 1.4. If the molecular orientation ratio exceeds 1.4, there will be variations in the strength characteristics in the width direction of the film. As a result, misregister occurs during transfer of the images, thus providing unsatisfactory transferred images. There is no restriction on the thickness of the film, but a preferred thickness is about 50 to 200 μm.

The molecular orientation ratio indicates the direction in which the molecular chains (main axis) of the main constituent polymer of the plastic film are distributed. It refers to the ratio of molecular chains in the direction of dense distribution to those in the direction of sparse distribution.

As has been known, molecular orientation can be grasped from X-ray diffraction patterns, infrared dichroism, thermal expansion rates, temperature-humidity expansion coefficients, or the ratio of mechanical strength in the longitudinal direction to that in the transverse direction. It can be determined more easily by means of the microwave molecular orientation meter MOR-2001A (Kanzaki Seishi Kabushiki Kaisha). Determination by this meter is based on the following principle: The interaction between a polarized electric field of microwave with a constant frequency and a dipole constituting a high molecular weight substance is related to the inner product of the vectors of the two parameters. Thus, when the sample is rotated, this interaction varies with the angle of rotation, whereby the molecular orientation ratio is determined (Japanese Laid-Open Patent Publication Nos. Sho 60-227156 and Sho 61-76942).

Molecular orientation ratio (MOR)= Maximum transmittance of microwave (Max)/ Minimum transmittance of microwave (Min)

With either method, the ratio of the maximum value to the minimum value obtained gives the molecular orientation ratio.

Next, the intermediate layer B provided between the substrate and the colored photosensitive layer will be described. The intermediate layer may be composed of a single or two layers. The single layer is selected from materials which are insoluble in water or chemicals for use in development; do not hamper the hue or transparency; are non-tacky and non-fusible at room temperature; are easily peelable from the substrate at room temperature; show sufficient adhesion, particularly after imagewise exposure, to the colored photosensitive layer to be laid on top thereof; and have sufficient adherence to the image receiving sheet. In the case of a dual layer, the first layer to be directly laminated on the substrate (i.e. B-1: release layer need not necessarily be insoluble in water or chemicals for use in development, but should be chosen mainly in consideration of its adherence to the substrate and its peelability from the second layer (i.e. B-2: heat-fusible layer). The second layer (i.e. B-2: heat-fusible layer) should be selected from materials which are insoluble in water or chemicals for use in development and which show sufficient adhesion, particularly after imagewise exposure, to the colored photosensitive layer to be applied on top thereof. It goes without saying that the first and second layers absolutely must be composed of a material which does not hamper the hue or transparency and which is non-tacky at room temperature, but becomes fusible when heated.

Examples of the above-mentioned materials for forming the intermediate layer are the following high molecular weight materials having film-forming properties: polyacrylates and acrylic ester copolymers; polymethacrylates and methacrylate ester copolymers; polyacrylamide and acrylamide copolymers; polyvinyl acetate and vinyl acetate copolymers; polyvinyl chloride and vinyl chloride copolymers; polyvinylidene chloride and vinylidene chloride copolymers; polystyrene and styrene copolymers; ethylene copolymers such as copolymers of ethylene with vinyl acetate, ethylene with acrylic ester, ethylene with vinyl chloride, and ethylene with acrylic acid; polyvinyl acetal resins such as polyvinyl butyral and polyvinyl formal; polyester resins; polyamides such as nylons and copolymeric nylons, rubbers such as synthetic rubbers and chlorinated rubbers; polyolefins such as polyethylene and polypropylene; cellulose derivatives; shellac; and waxes.

In addition, mixtures of these high molecular weight substances with each other, as well as mixtures with other substances, such as other high molecular weight substances, plasticizers, and supercooling materials, may be used. For example, even materials showing adherence at room temperature may be combined with other materials capable of preventing this adherence. Even materials showing no adherence when heated may be combined with materials imparting this adherence, plasticizers, etc. Thus, not only single materials, but also various combinations are conceivable. Hence, the materials for the intermediate layer are not necessarily restricted to the above-mentioned substances. To superimpose the intermediate layer on the substrate, a solution of the above-mentioned high molecular weight substance is coated onto the substrate and dried in the customary manner, or said high molecular weight material in solid form is coated as a hot melt, or a film comprising said high molecular weight material may be laminated. The thickness of the intermediate layer of the one-layer or two-layer type is 0.11 to 10 μm, preferably 0.5 to 3 μm, for each layer.

The colored photosensitive layer C that forms images on the intermediate layer will be described below. Any known photosensitive resins may be used as the colored photosensitive layer C, and their examples are as follows:

1. Compositions of water-soluble resins, such as gelatin, fish glue, gum arabic or polyvinyl alcohol, with ammonium dichromate, potassium dichromate or ammonium chromate.

2. Compositions comprising photosensitive ferric salts which provide ferrous ions upon exposure, such as ammonium ferric citrate or ammonium ferric oxalate, and water-soluble resins such as gelatin.

3. Compositions comprising water-soluble resins such as gelatin, fish glue, gum arabic, polyvinyl alcohol, polyacrylamide, carboxymethylcellulose or hydroxyethylcellulose, and tetrazonium salts of diamino compounds such as p-aminodiphenylamine, benzidine, dianisidine or toluisodine, or diazo resins obtained by condensation between p-diazodiphenylamine and paraformaldehyde.

4. Compositions comprising diazo resins obtained by condensation between diazo compounds, such as p-diazodiphenyl amine, and paraformaldehyde.

5. Compositions comprising azide compounds such as 4,4'-diazidostilbene-2,2'-disulfonic acid, disodiumsalt and water-soluble resins such as polyacrylamide, polyvinyl alcohol, polyvinyl pyrrolidone or gelatin.

6. Compositions comprising azide compounds such as 4,4'-diazidostilbene - 4,4'-diazidochalcone, and cyclized rubber.

7. Compositions of quinonediazide compounds, such as naphthoquinone-(1.2)-diazldosulfonic acid ester, with alkali-soluble phenol-formaldehyde resins.

8. Compositions comprising polymers having a cinnamic acid group introduced in the molecule, such as cinnamic acid esters of polyvinyl alcohol, and sensitizers such as nitroacenaphthene, 1,2-benzanthraqulnone or Michler's ketone.

9. Compositions comprising esters of acrylic acid or α-alkylacrylic acid with polyglycols, and polymerization initiators such as 9,10-anthraquinone.

10. Modified polyvinyl alcohol compositions comprising polyvinyl alcohol having a photosensitive group, such as stilylquinolinium or stilbazolium incorporated by addition reaction.

The colorants used for forming images of the photopolymer are pigments or dyes. Particularly when they are used for color correction, there are required pigments or dyes of tones consistent with the colors normally required, i.e. yellow, magenta, cyan and black.

Examples of the pigments are Benzidine yellow, Fast Yellow, Lake Red C, Carmine 6B, Watchung Red, Pordamine Lake B, Phthalocyanine Blue, Fast Sky Blue, carbon black, and mixtures of these.

Examples of oil-soluble dyes are Oil Yellow 5G, Oil Yellow 3G, Oil Red G, Oil Red HRR, Oil Red 5B, Oil Black HB, Zapon Fast Black RE, Zapon Fast Black B, Zapon Fast Blue ELE, Zapon Fast Red BB, Zapon Fast Red B, Zapon Fast Red GE, Zapon Fast Yellow G, Zapon Fast Yellow GR, and mixtures of these.

Examples of water-soluble dyes are Direct Fast Yellow GC, Tartrazine, Rose Bengale, Taflanin T, Rhodamine B, Congo Red, Direct Fast Sky Red 4BS, Methylene Blue, Soluble Blue Direct Sky Blue 5B, Acid Cyanine 6B, Victoria Blue B, Nigrosine, and mixtures of these dyes.

To the colored photosensitive layer C for forming images can be added, if desired, other components such as stabilizers for preventing a dark thermal reaction, leveling agents for improving coating properties, defoaming agents, and surface active agents. The thickness of the colored photosensitive layer should be minimal because of definition characteristics such as halftone reproduction. However, a suitable thickness is 1 to 5 μm to ensure image density from the colorant. In coating the colored photosensitive layer onto the intermediate layer, any known method may be employed, as long as it provides a uniform coating without pinholes.

An explanation will be offered below of the image receiving sheet which receives the colored photosensitive layer (images) of the photosensitive sheet. The substrate D of the image receiving sheet includes, for example, a paper, a plastic film, or a paper-plastic film composite material. Materials for use as the heat-fusible layer E to be laminated on the substrate in intimate contact should be materials which are non-adherent at room temperature, but become adherent and fusible when heated. More specifically, there should be selected materials which can be fused when heated together with the intermediate layer of the photosensitive sheet and the colored photosensitive layer (images) after exposure and development. Examples of such materials are the same as the materials for use as the intermediate layer of the photosensitive sheet. In this case, they should be selected from a wide variety of materials, including single materials as well as mixtures, after considering mainly, their heat fusion to the intermediate layer B and the colored photosensitive layer C (images). In applying the heat-fusible layer E onto the substrate of the image receiving sheet, a solution of the above-mentioned high molecular weight substance is coated onto the substrate and dried in a customary manner, or said high molecular weight material in solid form is coated as a hot melt, or a film comprising said high molecular weight material may be laminated. The thickness of the heat-fusible layer E is preferably 3 to 150 μm, although it depends on the resin used.

As shown in FIG. 1, the photosensitive sheet of the present invention is contact-exposed with actinic radiation through a film which has been obtained by the photomechanical process and which has been halftone separated for each color. Then, the sheet is developed to form an image (Step 1). At this time, by selecting the photosensitive sheet of the present invention in correspondence with each separated color, there is obtained the photosensitive sheet having the respective colored image (the sheet is colored in cyan by contact reversal from the film corresponding to the cyan plate). The intermediate layer B-2 exposed as the nonimage areas of the photosensitive sheet. The heat-fusible layer E of the image receiving sheet is heat fused to the colored photosensitive layer C-1 (image areas) after image formation; however, this type of adhesion is not complete, and firmer, complete heat transfer of the image is achieved when the layer E is mutually adhered to the heat-fusible intermediate layer B-2 exposed in the nonimage areas.

Then, the image bearing surface of the photosensitive sheet is contacted with the transfer surface of the image receiving sheet (the surface having the heat-fusible layer), and heated and pressed in the contacted state whereby the intermediate layer B-2 of the photosensitive sheet (unexposed areas, nonimage areas) and the heat-fusible layer E of the image receiving sheet are mutually adhered. (The photoset areas of the colored layer, i.e. the image areas, also undergo mutual adhesion to the heat-fusible layer E of the image receiving sheet; in this case, however, one of the layers is not heat-fusible, and so as firm adhesion as with the nonimage areas cannot be expected.) Then, the substrate A of the photosensitive sheet is peeled together with the intermediate layer B-1, whereby the color-separated image is easily and firmly transferred to the image receiving sheet together with the intermediate layer B-2 (Step 2).

Further, a colored image of the second color is heat-transferred onto the thus transferred image. In this case, the heat-fusible layer (the intermediate layer B-2 for the first color) is present on the surface after transfer of the image of the first color; hence, the colored image of the second color can be easily and firmly transferred like the image of the first color (Step 3). Different colored images of the third or more colors are easily transferred in succession along with the intermediate layer B-2 like the image of the second color. After the final transfer of a colored image is completed, the substrate A of the photosensitive sheet is peeled together with the release layer B-1 (Step 4). Then, the exposed surface of the intermediate layer B-2 of the photosensitive sheet is contacted with a desired transfer sheet, followed by heating and pressing, causing heat fusion. Then, the substrate D of the image receiving sheet is peeled from the heat-fusible layer E, whereby a multicolor image can be formed on the transfer sheet (Step 5). If the tones (basically, cyan, magenta, yellow and black) and densities of the colored images are selected so as to resemble those of printing inks, a multicolor image closely resembling a final print can be obtained, and can be used for a color correcting sheet similar to a proof print.

As is evident from the foregoing explanation, the molecular orientation ratio of a biaxially stretched plastic film used as a substrate of a photosensitive sheet is set at 1.0 to 1.4, and unevenness in strength is eliminated, thereby correcting misregister. This contributes greatly to improving the operating efficiency of preparing a printing plate.

EXAMPLES

Examples will be offered below to illustrate the present invention in greater detail, but the invention is in no way limited thereto.

A solution for forming the release layer B-1 of the photosensitive sheet had the following composition:

|  | Parts |
| --- | --- |
| Acrylic polyol | 45 |
| (Thermolac U-245B, Soken Kagaku Kabushiki Kaisha) | |
| Isocyanate | 20 |
| (Takenate D-110, Takeda Chemical Industries, Ltd.) | |
| Silica | 5 |
| (Mizucaseal P-527H, Mizusawa Kagaku Kabushiki Kaisha) | |
| Toluene | 100 |
| Ethyl acetate | 100 |
| Ethyl cellulose | 50 |

A solution for forming the heat-fusible layer B-2 of the photosensitive sheet had the following composition:

|  | Parts |
| --- | --- |
| Polyester resin (Pyronal MD-14, Toyobo Co., Ltd) | 100 |

A solution for forming the colored photosensitive layer C of the photosensitive sheet had the following composition:

|  | Parts |
| --- | --- |
| 10% aqueous solution of SbQ-modified PVA (1.25 mol % N-methyl-stilbazole group introduced; average polymerization degree 1700, saponification degree 88%) | 100 |
| Coloring pigment dispersion (20% aqueous dispersion of carbon black) | 4 |
| Water | 100 |
| Isopropyl alcohol | 10 |

This was a solution for forming the colored photosensitive layer for black. Solutions for forming the colored photosensitive layers for cyan, magenta and yellow were prepared in the same manner as above using Phthalocyanine Blue, Permanent Carmine FB, and Permanent Yellow HR, respectively, instead of carbon black.

A solution for forming the heat-fusible layer E of the image receiving sheet had the following composition:

|  | Parts |
| --- | --- |
| Ethylene-acrylic acid ester copolymer (AC-1000, Mitsubishi Petrochemical Fine) | 20 |
| Methanol | 50 |
| Water | 50 |

A photosensitive sheet was prepared in the following manner: A solution for forming the release layer B-1 having the above formulation was coated on a substrate as indicated in Table 1 by means of a roll coater, and dried for 1 minute in a drying zone at 100° C. to form a release layer about 3 μm in thickness. Then, a solution for forming the heat-fusible layer B-2 having the above formulation was coated on the release layer by means of a roll coater, and dried for 1 minute in the drying zone at 100° C. to form a heat-fusible layer about 2 μm in thickness. Further, a solution for forming the colored photosensitive layer C having the above formulation was coated on the heat-fusible layer by means of a roll coater, and dried for 1 minute in the drying zone at 100° C. to form a colored photosensitive layer.

A color separation halftone negative film of a respective color was contacted with the colored photosensitive surface of the thus obtained photosensitive material. Exposure for 30 seconds was given by a high pressure mercury lamp of 2 Kw at a distance of 1 m. Then, the unexposed areas were washed away with water at ordinary temperature ejected from a nozzle at a pressure of 1 kg/cm$^2$. Then, the water was shaken off, and the sheet was dried with warm air at 50° C. to obtain an image of a respective tone.

Separately, an image receiving sheet was also subjected to a similar procedure in which a solution for forming the heat-fusible layer E was coated on the substrate to a thickness of about 4 μm by means of a roll coater and dried.

The image bearing surface of the photosensitive sheet having the thus formed image of the first color and the heat-fusible surface of the image receiving sheet were superimposed on each other. These superimposed materials were pressed between rollers heated at 100° C., whereafter the substrate of the photosensitive sheet was peeled off. The colored image C was thereby transferred onto the image receiving sheet together with the heat-fusible layer B-2. Then, the same procedure as set forth above was repeated for the other three colors in succession, thereby forming a four-color halftone image on the image receiving sheet.

Plastic film samples with different orientation ratios as indicated in Table 1 were used as substrates for Examples 1 to 3 and Comparative Examples 1 to 3, respectively, to confirm differences in misregister. These samples were all slit to a size of 1,100 mm after film formation, and then subjected to processing (treatment) for production of photosensitive sheets. The right and left sides of the center of the slit product were cut to a size of 508 mm×610 mm (width× length) each, and the resulting right and left portions were used in combination. Misregister was evaluated as follows: Register marks were formed at the four corners of the colored photosensitive sheet at distances of 500 mm in the X direction (width direction) and 600 mm in the Y direction (the direction of flow) perpendicular to the X direction. After the transfer of images of four colors, the amounts of deviation of the respective register marks in the X and Y directions were measured. The amount of deviation on the diagonal line was calculated from the following equation to perform the evaluation.

Amount of deviation on the diagonal line =

$$\sqrt{(\text{amount of deviation in the } X \text{ direction})^2 + (\text{amount of deviation in the } Y \text{ direction})^2}$$

The results are shown in Table 1.

Examples 1 and 2 used samples with a molecular orientation ratio of 1.4 or less. Example 3 involved a sample with a molecular orientation ratio of 1.4 which was further annealed. All these samples gave satisfactory multicolor images with a minimal misregister of 50μ or less. It was also found that a molecular orientation ratio of 1.4 or less resulted in a lower effect of annealing. In the Comparative Examples, the resulting multicolor images were all poor with a misregister of 100μ or more, and they were not suitable for color proof. Comparative Example 1 used that portion of the polyethylene terephthalate film HS-100 (Teijin Ltd.) which had a molecular orientation ratio of 2.3. Comparative Example 2 used that portion of the polyethylene terephthalate film T-60 (Toray Industries, Inc.) which had a molecular orientation ratio of 2.7. Comparative Example 3 used the sample of Comparative Example 2 that was further annealed. The annealed sample had a molecular orientation ratio of 2.7, showing no changes in molecular orientation compared with the non-annealed sample.

As is obvious from the above description, the photosensitive sheet of the present invention using a biaxially stretched plastic film with a molecular orientation ratio in the range of from 1.0 to 1.4 was able to minimize misregister without lowering productivity. It was also able to prepare a satisfactory prepress color proof.

TABLE 1

|  | Molecular orientation ratio | Misregister | Remarks |
| --- | --- | --- | --- |
| Ex. 1 | 1.10 | 30 μ |  |
| Ex. 2 | 1.40 | 50 μ |  |
| Ex. 3 | 1.40 | 40 μ | Annealed product |

TABLE 1-continued

| | Molecular orientation ratio | Misregister | Remarks |
|---|---|---|---|
| Comp. Ex. 1 | 2.30 | 100 μ | |
| Comp. Ex. 2 | 2.70 | 150 μ | |
| Comp. Ex. 3 | 2.70 | 120 μ | Annealed product |

The molecular orientation ratio was determined based on the results of measurement by means of the microwave molecular orientation meter MOR-2001A.

What is claimed is:

1. A photosensitive sheet suitable for use in forming a multi-colored image or multi-colored images for transfer to an image receiving sheet, said photosensitive sheet consisting essentially of a substrate film on which are disposed (a) (i) a heat-fusible resin layer which is peelable from the substrate, or (ii) a release layer and a heat-fusible resin layer which is peelable from the release layer on the substrate; and (b) a colored photosensitive layer in this order said substrate comprising a biaxially stretched plastic film and having a molecular orientation ratio in the range of from 1.0 to 1.4 wherein the colored photosensitive layer of said sheet is exposed and developed prior to being transferred on to an image receiving sheet.

2. The photosensitive sheet of claim 1 wherein said plastic film is polyethylene terephthalate, polyethylene terephthalate, or polyimide.

3. The photosensitive sheet of claim 1 wherein said colored photosensitive layer is a composition comprising a water-soluble resin selected from the group consisting of gelatin, fish glue, gum arabic or polyvinyl alcohol and a compound selected from the group consisting of ammonium dichromate, potassium dichromate or ammonium chromate.

4. The photosensitive sheet of claim 1 wherein said colored photosensitive layer is a composition comprising gelatin, and ammonium ferric citrate or ammonium ferric oxalate.

5. The photosensitive sheet of claim 1 wherein said colored photosensitive layer is a composition comprising a water-soluble resin selected from the group consisting of gelatin, fish glue, gum arabic, polyvinyl alcohol, polyacrylamide, carboxymethylcellulose and hydroxyethylcellulose, and a tetrazonium salt of a diamino compound selected from the group consisting of p-aminodiphenylamine, benzidine, dianisidine and toluisodine or a diazo resin obtained by condensation between p-diazodiphenylamine and paraformaldehyde.

6. The photosensitive sheet of claim 1 wherein said colored photosensitive layer is a composition comprising a diazo resin obtained by condensation between p-diazodiphenylamine and paraformaldehyde.

7. The photosensitive sheet of claim 1 wherein said colored photosensitive layer is a composition comprising an azide compound of 4,4'-diazidostilbene-2,2'-disulfonic acid disodiumsalt and a water-soluble resin selected from the group consisting of polyacrylamide, polyvinyl alcohol, polyvinyl pyrrolidone and gelatin.

8. The photosensitive sheet of claim 1 wherein said colored photosensitive layer is a composition comprising an azide compound of 4,4'-diazidostilbene-4,4'-diazidochalcone and cyclized rubber.

9. The photosensitive sheet of claim 1 wherein said colored photosensitive layer is a composition comprising a quinonediazide selected from the group consisting of naphthoquinone-(1,2)-diazldosulfonic acid ester and an alkali-soluble phenol-formaldehyde resin.

10. The photosensitive sheet of claim 1 wherein said colored photosensitive layer is a composition comprising a cinnamic acid ester of polyvinyl alcohol and a sensitizer selected from the group consisting of nitroacenaphthene, 1,2-benzanthraquinone and Michler's ketone.

11. The photosensitive sheet of claim 1 wherein said colored photosensitive layer is a composition comprising an ester of acrylic acid or α-alkylacrylic acid with polyglycols, and 9,10-anthraquinone.

12. The photosensitive sheet of claim 1 wherein said colored photosensitive layer is a modified polyvinyl alcohol composition comprising polyvinyl alcohol having a photosensitive group selected from the group consisting of stilylquinolinium and stilbazolium incorporated by addition reaction.

* * * * *